(12) United States Patent
Lofthouse-Zeis et al.

(10) Patent No.: US 7,164,108 B2
(45) Date of Patent: Jan. 16, 2007

(54) DETECTION SYSTEM FOR OPTICAL BEAM POINTING AND SHAPING

(75) Inventors: Jay T. Lofthouse-Zeis, Pleasanton, CA (US); Tracy Francis Thonn, Sunnyvale, CA (US)

(73) Assignee: Coherent, Inc., Santa Clara, CA (US)

( * ) Notice: Subject to any disclaimer, the term of this patent is extended or adjusted under 35 U.S.C. 154(b) by 426 days.

(21) Appl. No.: 10/422,206

(22) Filed: Apr. 24, 2003

(65) Prior Publication Data

US 2004/0211887 A1 Oct. 28, 2004

(51) Int. Cl.
*G01J 1/20* (2006.01)
(52) U.S. Cl. .................. 250/201.1; 250/201.7
(58) Field of Classification Search .......... 250/201.1, 250/201.5, 201.6, 201.7, 206.1; 356/152, 356/609; 365/152
See application file for complete search history.

(56) References Cited

U.S. PATENT DOCUMENTS

| 3,579,140 | A | | 5/1971 | Anderson et al. ......... 331/94.5 |
|---|---|---|---|---|
| 4,654,949 | A | * | 4/1987 | Pryor ....................... 29/407.04 |
| 4,757,197 | A | | 7/1988 | Lee .............................. 250/239 |
| 4,930,896 | A | * | 6/1990 | Horikawa .................... 356/609 |
| 5,123,737 | A | | 6/1992 | Eichweber ................... 356/152 |
| 5,166,505 | A | | 11/1992 | Gorriz et al. ............. 250/201.7 |
| 5,465,243 | A | | 11/1995 | Boardman et al. ............ 369/49 |
| 6,043,505 | A | | 3/2000 | Ames et al. ................. 250/577 |
| 6,363,038 | B1 | * | 3/2002 | Yanagawa ................ 369/44.32 |

* cited by examiner

*Primary Examiner*—Thanh X. Luu
*Assistant Examiner*—Tony Ko
(74) *Attorney, Agent, or Firm*—Stallman & Pollock LLP

(57) ABSTRACT

Apparatus for circularizing an optical beam and directing the beam into an optical system has mutually perpendicular X, Y, and Z axes. The Z-axis is the propagation axis of the beam. A detector arrangement receives a sample of the optical beam. The detector arrangement has four detector elements arranged in four quadrants defined by an x-axis and a y-axis of the detector arrangement, perpendicular to each other. The x and y-axes of the quadrant detector are arranged at 45 degrees to the X and Y-axes of the apparatus. Signals from the four detector elements provide information on the extent to which the beam is not circular and on any displacement of the beam in the X and Y-axes.

16 Claims, 2 Drawing Sheets

DETECTION SYSTEM FOR OPTICAL BEAM POINTING AND SHAPING

TECHNICAL FIELD OF THE INVENTION

The present invention relates generally to the use of quadrant detectors for determining position of a projected optical beam. The invention relates in particular to a method of determining the position and shape of a projected optical beam from information derived from a single quadrant detector.

DISCUSSION OF BACKGROUND ART

A four-quadrant detector is commonly used for determining position of a projected optical beam in an optical apparatus, and providing signals that are used to drive one or more movable optical components for steering the beam. One example of a laser beam to be steered is an output beam from a laser.

A laser output beam may be subject to variations in its direction and shape as a result of changes in parameters of the output beam such as output power, pulse width, pulse repetition frequency, and the like. The shape of a laser beam can be modified by passing it through an optical system including one or more optical elements that have different optical power in different transverse optical axes. Variations in the shape of the output beam can be corrected by moving one or more elements of the optical system with respect to another to change the magnification of the system in one of the axes in preference to the other. It would be advantageous to derive information regarding the position and shape of a laser output beam from a single quadrant detector.

SUMMARY OF THE INVENTION

The present invention is directed to apparatus for circularizing an optical beam and directing the beam into an optical system. The apparatus has mutually perpendicular X, Y, and Z axes, the Z-axis being the propagation axis. In one aspect of the invention, the apparatus comprises a detector arrangement arranged to receive a sample of the optical beam. The detector arrangement has first, second, third, and fourth detector elements arranged in first, second, third, and fourth quadrants defined by an x-axis and a y-axis of the detector arrangement, perpendicular to each other. The x and y-axes of the quadrant detector are arranged at 45 degrees to the X and Y-axes of the apparatus.

The 45-degree arrangement of the quadrant axes with respect to the optical system axes provides that signals from all four detector elements can be used to determine the extent to which the beam is not circular. Signals from opposite ones of the detector elements can also be used to determine the extent to which the beam is displaced from the Z-axis in the X and Y-axes.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain the principles of the present invention.

DETAILED DESCRIPTION OF THE INVENTION

Figure 1:
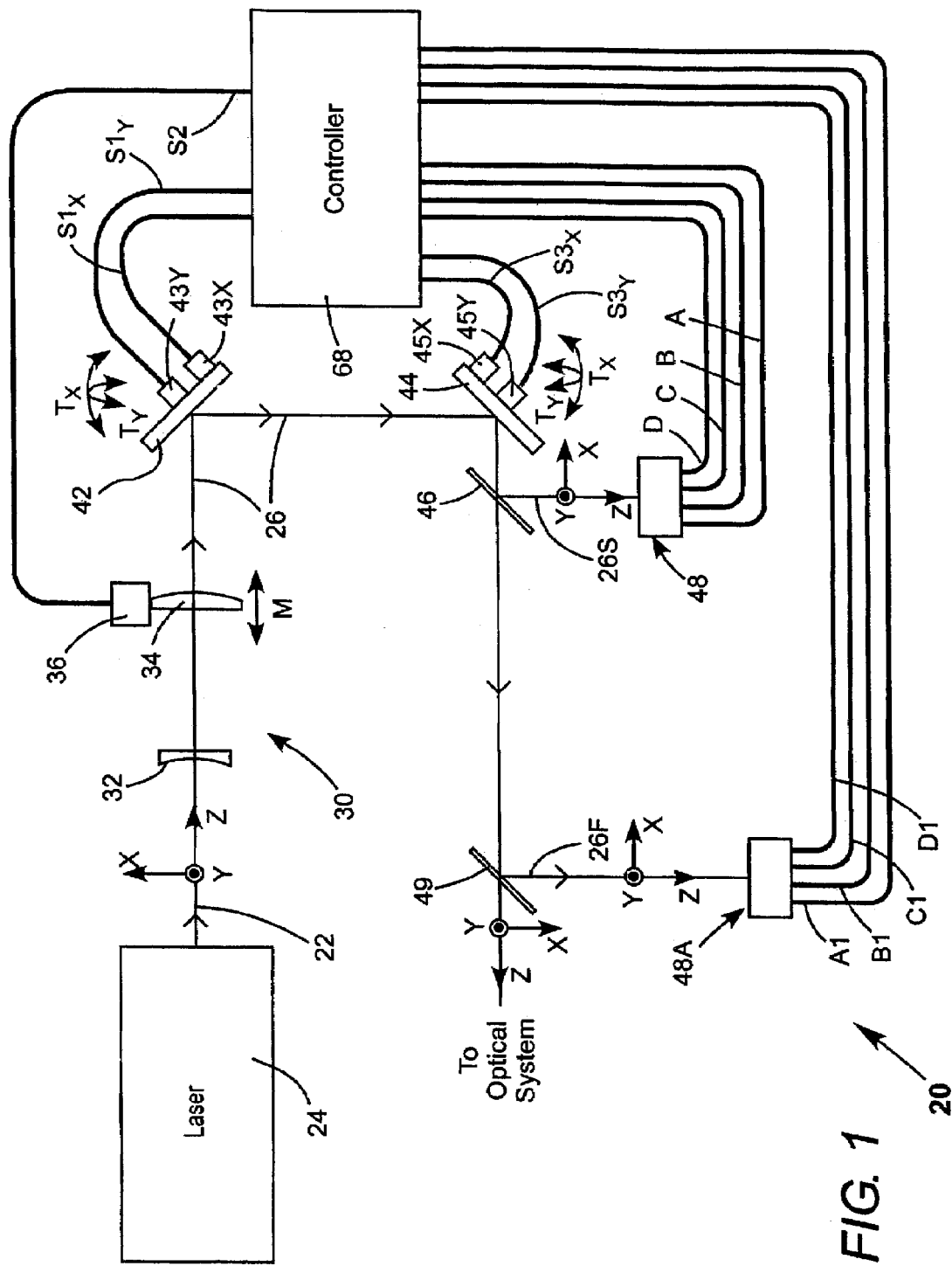
FIG. 1 schematically illustrates an optical system including a laser delivering an output beam, an axially preferential beam-expander including a movable element for changing the cross-section shape of the beam, a bi-axially tiltable mirror for changing the direction of the beam, and a quadrant detector and associated circuitry arranged in accordance with the present invention for deriving signals representative of the shape and position of the laser output beam and moving the movable optical element and tilting the tiltable mirrors in accordance with those signals.

Turning now to the drawings, FIG. 1 schematically illustrates apparatus 20 in accordance with the present invention. The apparatus is used for shaping a laser beam 22 received from a laser 24 and delivering a shaped beam 26 to an optical system (not explicitly shown).

Figure 2:
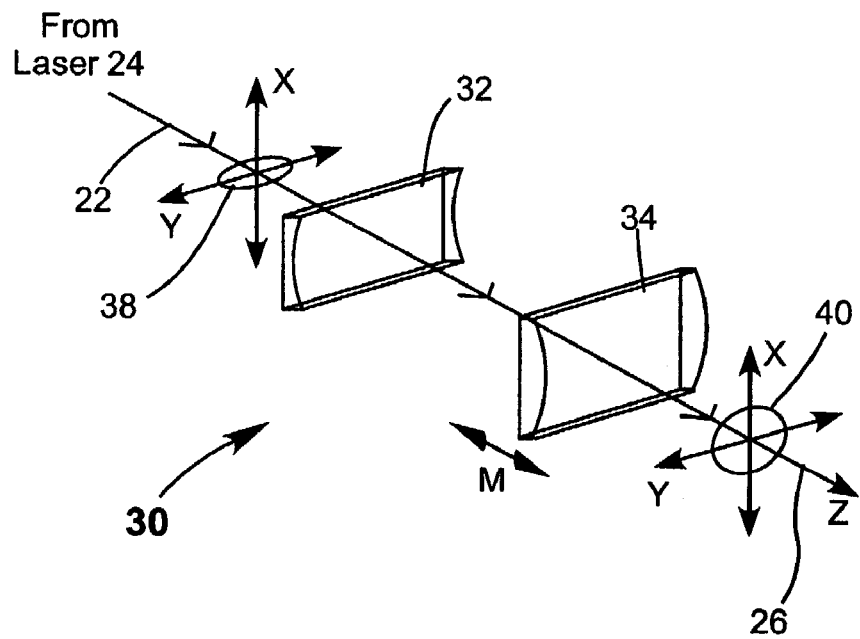
FIG. 2 is an isometric view schematically illustrating the arrangement of optical elements of the beam expander of FIG. 1 with respect to Cartesian transverse axes of the optical system of FIG. 1.

Continuing with reference to FIG. 1, and with reference additionally to FIG. 2, apparatus 20 includes a single-axis, afocal beam-expander 30. Beam expander 30 includes a cylindrical negative optical element 32 and a cylindrical positive element 34. The optical elements are aligned in a Cartesian coordinate system having an Z-axis defining a longitudinal axis or axis of propagation, and X-axis and a Y-axis perpendicular to each other and perpendicular to the Z-axis. The X, Y, and Z-axes are here considered as the axes of beam expander 30 and of the entire optical system of apparatus 20. Optical elements 32 and 34 have zero optical power in the Y-axis. Element 32 has negative optical power in the X-axis and element 34 has positive optical power in the X-axis. Element 34 is movable by an actuator 36 (see FIG. 1) along the Z-axis as indicated by double arrow M.

Beam 22 on leaving laser 24 has an elliptical cross-section shape, indicated in FIG. 2 by ellipse 38, having its major axis aligned in the Y-axis of beam-expander 30. Beam 22 is collimated in both the X-axis and the Y-axis. Beam expander 30 increases the beam dimension in the X-axis while the beam dimension in the Y-axis is essentially unchanged. The power of the optical elements and the position of element 34 with respect to element 32 is selected such that transmitted (shaped) beam 26 ideally has a circular cross section, indicated in FIG. 2 by circle 40. The beam expander is arranged to be nominally an afocal beam expander with shaped beam 26 leaving element 34 collimated in both the X-axis and in the Y-axis. Variations in elliptical cross-section 38 due to changes in operating parameters of laser 24 can be compensated by moving optical element 34 of beam expander 30 as indicated by double arrow M. Variations in the propagation direction of beam 22, and accordingly of transmitted beam 26, can be at least partially compensated by reflecting beam 26 sequentially off mirrors 42 and 44. Mirror 42 is tiltable, by actuators 43X and 43Y, in the X-axis and the Y-axis respectively as indicated in FIG. 1 by double arrows $T_X$ and $T_Y$ respectively. Mirror 44 is tiltable, by actuators 45X and 45Y, in the X-axis and the Y-axis respectively as indicated again in FIG. 1 by double arrows $T_X$ and $T_Y$ respectively. A preferred arrangement in accordance with the present invention for detecting changes in shape or direction of the shaped beam is described below with continuing reference to FIG. 1 and with reference additionally to FIG. 3.

Figure 3:
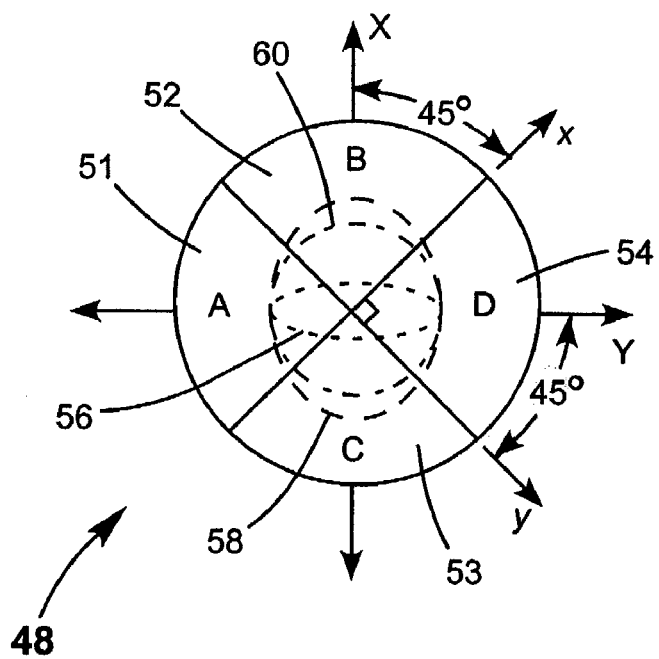
FIG. 3 schematically illustrates the arrangement of Cartesian quadrant axes of the quadrant detector of FIG. 1 with respect to the Cartesian transverse axes of the optical system of FIG. 1.

Following reflection from mirror 42 and 44, beam 26 is transmitted through a beamsplitter 46, which reflects a sample 26S, for example about one percent, of beam 26 onto a quadrant detector arrangement 48. Referring to FIG. 3, detector arrangement 48 (here viewed from the side thereof on which sample 26S is incident) each include four detector elements 51, 52, 53, and 54 arranged in quadrants of a Cartesian axis system having an x-axis and a y-axis perpendicular to each other. The x-axis and the y-axis are arranged at forty-five degrees (45°) to respectively the X-axis and the Y-axis of beam expander 30, and, correspondingly, at 45° to the X and Y-axes of apparatus 20. The x-axis and the y-axis of the detector arrangement intersect at the intersection of the X-axis and the Y-axis. Dotted circles 56, 58, and 60 schematically respectively indicate the shape of an under-corrected elliptically shaped beam, an over-corrected elliptically shaped beam, and a corrected (circular shaped) beam. All are depicted as centered on the intersection of the quadrant x-axis and the y-axis, indicating, in this case, that the beam 26 from which they are sampled, here, is centered on the Z-axis of beam expander 30.

Quadrant detector elements 51, 52, 53, and 54, provide signals A, B, C, and D respectively. The magnitude of each signal depends on the portion of a beam that is incident on the detector element providing that signal. The inventive 45° inclination of the quadrant x-axis and y-axis with the optical X-axis and Y-axis of beam expander 30, allows signals A, B, C, and D to be processed by a controller 68 to provide signals representative of the departure from a circular shape of an incident beam sample 26S, and also to provide a signal representative of the displacement of the beam sample from the intersection (origin) of the x-axis and the y-axis, and correspondingly the displacement of beam 26 from the Z-axis at detector 48.

In most cases, changes in direction of the shaped beam and changes in beam cross-section shape as a result in changes in output parameters of the beam will be relatively small. By way of example, beam direction changes may be on the order of a few microradians. Further by way of example, cross-sectional shape changes from ideally circular may result in an elliptical cross section having an ellipticity (ratio of major axis to minor axis) of about 1.1.

If beam 26 is symmetrical about the X and Y axes, in cases where the change in beam direction is relatively small, the displacement of the beam from the Z-axis at detector 48 will also be relatively small, in which case, the X and Y-axis displacement of the beam, independent of the shape of the beam, can be represented by quantities:

$$X=(B-C)/(B+C) \quad (1)$$

and $$Y=(D-A)/(D+A) \quad (2)$$

where X and Y represent coordinates in the X and Y-axis system, and, when X and Y are zero, beam 26, independent of the shape thereof, is centered on the Z axis. X and Y can amplified, and further processed if necessary, to provide command signals $S1_X$ and $S1_Y$ respectively (see FIG. 1) for driving mirror 42 via actuators 43X and 43Y to at least partially compensate for the change in beam direction.

Ellipticity of the beam, i.e., the extent to which the beam is not circular, can be determined by a quantity:

$$E=[(A+D)-(B+C)]/(A+B+C+D) \quad (3)$$

when beam 26 is centered on detector 48. Accordingly, when X, Y, and E are zero, beam 26 has a circular cross-section shape. Quantity E can be amplified and further processed if necessary to provide a signal S2. Signal S2 commands actuator 36 to move element 34 until the value of E is zero, at which point beam 26 has a circular cross section at the detector, i.e., at a point along the Z-axis represented by sample 26S on detector 48. It should be noted, here, that equation (3) is valid only if all of sample 26S is collected by detector 48.

A consequence of moving element 34 of beam expander 30 to maintain a circular shape of beam 26 at detector 48 is that the afocal arrangement of the beam expander will be disturbed, possibly resulting in some difference in divergence of the beam in the X-and Y-axes, i.e., astigmatism. If any astigmatism is present in beam 26, this would manifest itself in that a sample beam having a circular cross-section at a point along the Z-axis represented by sample 26S on detector 48 would not have a circular cross-section at detector arrangement at some other point on the Z-axis. Such astigmatism could be detected by a second sampling beamsplitter and detector arrangement in accordance with the present invention located along the Z-axis in the direction of propagation.

Such a beamsplitter is depicted in FIG. 1 as beamsplitter 49. Beamsplitter 49 directs a sample 26F of the beam 26 onto a detector arrangement 48A configured similar to detector 48 of FIG. 3, with the quadrant axes of the detector having their origin on the Z-axis. Detector 49 provides signals A1, B1, C1, and D1 corresponding to signals A, B, C, and D of detector 48. A signal representative of the cross-section shape of the beam at the second detector can be determined as described above with reference to detector 48 and be used to monitor astigmatism or operate a device (not shown) for correcting the astigmatism. By way of example such an astigmatism-correcting device could be a tiltable plate or one or more additional, axially movable optical elements.

Signals A1, B1, C1, and D1 also provide X and Y axis displacement information and are used to generate command signals $S3_X$ and $S3_Y$ for operating mirror 44. Mirrors 42 can be operated cooperatively such that sample 26S and 26F are centered on detectors 48 and 48A, thereby fully correcting any direction change of beam 26 leaving laser 24.

Those skilled in the art will recognize that other variations of the above-described beam pointing and shaping apparatus are possible without departing from the spirit and scope of the present invention. By way of example, beam expander 30 may include more than two optical elements, with more than one element movable with respect to another, and with one or more elements being spherical elements. Any "cylindrical" element may have finite optical power in both the X-axis and the Y-axis but with optical power in one of the axes being greater than that in the other. Regarding the inventive 45° degree inclination of the quadrant detector x-axis and y-axis with respect to the X-axis and Y-axis of beam expander 30, those skilled in the art may determine other signal processing algorithms for providing errors signals representative of beam-shape, astigmatism, or beam-displacement, without departing from the spirit and scope of the present invention.

In summary, the present invention is described above with respect to a preferred and other embodiments. The invention is not limited, however, to the embodiments described and depicted herein. Rather, the invention is limited only by the claims appended hereto.

What is claimed is:

1. An apparatus for circularizing a laser beam and directing the beam into an optical system, said laser beam having an ellipticity defined by orthogonal beam diameters along X and Y axes, said apparatus comprising:
    beam shaping optics through which the laser beam passes, said optics being adjustable to control the ellipticity of the beam by varying the relative X and Y diameters of the beam, said beam shaping optics including at least one cylindrical lens, the position of which is adjustable along the propagation axis of the laser beam to vary the ellipticity of the beam;
    a beam splitter for separating the beam into first and second portions, the first portion being directed into the optical system;
    a quadrant detector positioned to receive the second portion of the beam, with each quadrant generating an output signal, said quadrant detector being oriented so that the axes dividing the quadrants are positioned at a 45 degree angle with respect to the X and Y axes of the beam; and
    a controller receiving the output signals from the detector and generating control signals which are supplied to the beam shaping optics in order to vary the relative diameters of the beam in order to minimize the ellipticity thereof.

2. An apparatus as recited in claim 1, wherein the controls signals are generated based upon a determination which includes calculating the sum of the output signals from the two detector quadrants aligned with the X axis of the beam minus the sum of the output signals from the two detector quadrants aligned with the Y axis of the beam.

3. An apparatus as recited in claim 1, wherein said beam shaping optics include a pair of cylindrical lenses, with the spacing between the lenses being adjustable to vary the ellipticity of the beam.

4. An apparatus as recited in claim 1, further including a movable turning mirror and wherein said controller utilizes the output signals from the detector to determine the displacement of the beam on the detector from a centered position and generate second control signals which are supplied to the turning mirror to adjust the propagation direction of the beam.

5. An apparatus as recited in claim 4, wherein said second control signals are generated based upon a determination which includes calculating the difference between the output signals from the two detector quadrants aligned with X axis of the beam to provide information about beam displacement in the X direction and calculating the difference between the output signals from the two detector quadrants aligned with the Y axis of the beam to provide information about beam displacement in the Y direction.

6. An apparatus as recited in claim 1, further including a second beam splitter, located downstream from the first beam splitter and directing a third portion of the beam to a second quadrant detector, with each quadrant generating an output signal, said second quadrant detector being oriented so that the axes dividing the quadrants are positioned at a 45 degree angle with respect to the X and Y axes of the beam, the output signals being used by the controller to determine any residual astigmatism in the beam.

7. An apparatus for circularizing a laser beam and directing the beam into an optical system, said laser beam having an ellipticity defined by orthogonal beam diameters along X and Y axes, said apparatus comprising:
    beam shaping optics through which the laser beam passes, said optics being adjustable to control the ellipticity of the beam by varying the relative X and Y diameters of the beam;
    a beam splitter for separating the beam into first and second portions, the first portion being directed into the optical system;
    a movable turning mirror located after the beam shaping optics and before the beam splitter for turning the beam;
    a quadrant detector positioned to receive the second portion of the beam, with each quadrant generating an output signal, said quadrant detector being oriented so that the axes dividing the quadrants are positioned at a 45 degree angle with respect to the X and Y axes of the beam; and
    a controller receiving the output signals from the detector and generating first control signals which are supplied to the turning mirror to adjust the propagation direction of the beam and second control signals which are supplied to the beam shaping optics in order to vary the relative diameters of the beam in order to minimize the ellipticity thereof.

8. An apparatus as recited in claim 7, wherein the second controls signals are generated based upon a determination which includes calculating the sum of the output signals from the two detector quadrants aligned with the X axis of the beam minus the sum of the output signals from the two detector quadrants aligned with the Y axis of the beam.

9. An apparatus as recited in claim 7, wherein said beam shaping optics include a pair of cylindrical lenses, with the spacing between the lenses being adjustable to vary the ellipticity of the beam.

10. An apparatus as recited in claim 7, wherein said first control signals are generated based upon a determination which includes calculating the difference between the output signals from the two detector quadrants aligned with X axis of the beam to provide information about beam displacement in the X direction and calculating the difference between the output signals from the two detector quadrants aligned with the Y axis of the beam to provide information about beam displacement in the Y direction.

11. An apparatus as recited in claim 7, further including a second beam splitter, located downstream from the first beam splitter and directing a third portion of the beam to a second quadrant detector, with each quadrant generating an output signal, said second quadrant detector being oriented so that the axes dividing the quadrants are positioned at a 45 degree angle with respect to the X and Y axes of the beam, the output signals being used by the controller to determine any residual astigmatism in the beam.

12. An apparatus for circularizing a laser beam and directing the beam into an optical system, said laser beam having an ellipticity defined by orthogonal beam diameters along X and Y axes, said apparatus comprising:
    beam shaping optics through which the laser beam passes, said optics being adjustable to control the ellipticity of the beam by varying the relative X and Y diameters of the beam;
    a beam splitter for separating the beam into first and second portions, the first portion being directed into the optical system;
    a quadrant detector positioned to receive the second portion of the beam, with each quadrant generating an output signal, said quadrant detector being oriented so that the axes dividing the quadrants are positioned at a 45 degree angle with respect to the X and Y axes of the beam;

a controller receiving the output signals from the detector and generating control signals which are supplied to the beam shaping optics in order to vary the relative diameters of the beam in order to minimize the ellipticity thereof; and a second beam splitter, located downstream from the first beam splitter and directing a third portion of the beam to a second quadrant detector, with each quadrant generating an output signal, said second quadrant detector being oriented so that the axes dividing the quadrants are positioned at a 45 degree angle with respect to the X and Y axes of the beam, the output signals being used by the controller to determine any residual astigmatism in the beam.

13. An apparatus as recited in claim 12, wherein the controls signals are generated based upon a determination which includes calculating the sum of the output signals from the two detector quadrants aligned with the X axis of the beam minus the sum of the output signals from the two detector quadrants aligned with the Y axis of the beam.

14. An apparatus as recited in claim 12, wherein said beam shaping optics include a pair of cylindrical lenses, with the spacing between the lenses being adjustable to vary the ellipticity of the beam.

15. An apparatus as recited in claim 12, further including a movable turning mirror and wherein said controller utilizes the output signals from the detector to determine the displacement of the beam on the detector from a centered position and generate second control signals which are supplied to the turning mirror to adjust the propagation direction of the beam.

16. An apparatus as recited in claim 15, wherein said second control signals are generated based upon a determination which includes calculating the difference between the output signals from the two detector quadrants aligned with X axis of the beam to provide information about beam displacement in the X direction and calculating the difference between the output signals from the two detector quadrants aligned with the Y axis of the beam to provide information about beam displacement in the Y direction.

* * * * *